Figure 1:
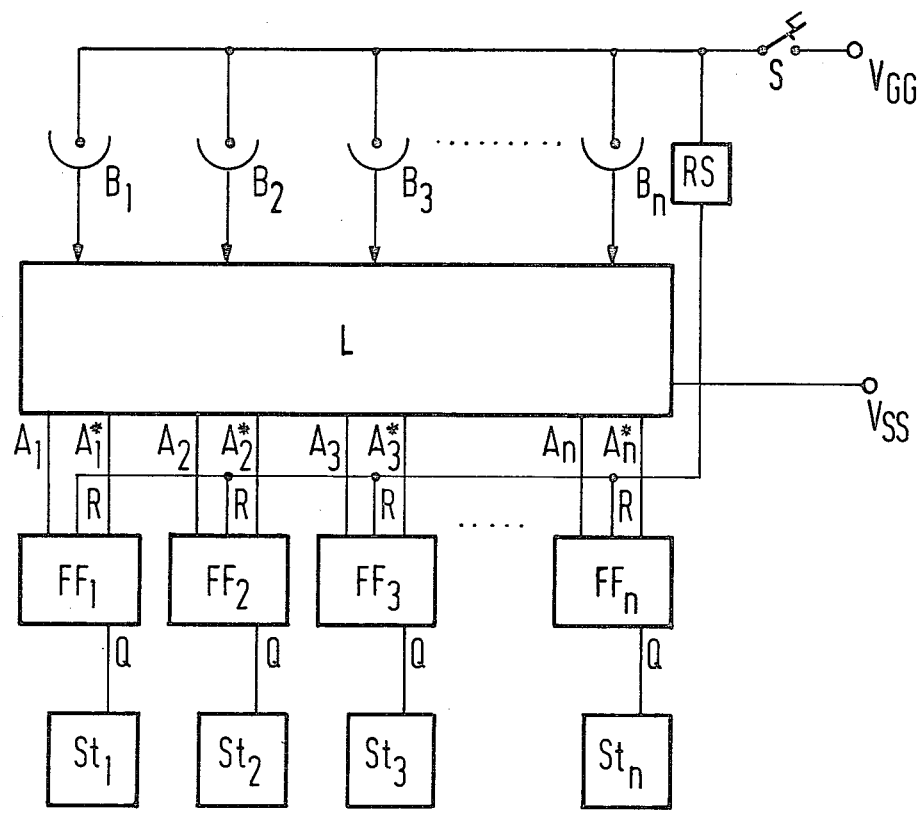

United States Patent [19]

Rösler

[11] 4,380,705
[45] Apr. 19, 1983

[54] DIGITAL SEMICONDUCTOR CIRCUIT

[75] Inventor: Helmut Rösler, Munich, Fed. Rep. of Germany

[73] Assignee: Siemens Aktiengesellschaft, Berlin and Munich, Fed. Rep. of Germany

[21] Appl. No.: 154,576

[22] Filed: May 29, 1980

[30] Foreign Application Priority Data

Jun. 5, 1979 [DE] Fed. Rep. of Germany ......... 333863

[51] Int. Cl.³ ..................... H03K 17/56; H03K 19/20
[52] U.S. Cl. ........................... 307/247 R; 307/247 A; 307/445; 328/190
[58] Field of Search ............... 307/247 A, 247 R, 445; 328/70, 196

[56] References Cited

U.S. PATENT DOCUMENTS

| 3,634,769 | 1/1972 | Sleater | 307/247 R |
| 3,693,028 | 9/1972 | Fussell | 307/247 R |
| 4,251,740 | 2/1981 | Wilwerding | 307/247 A |

*Primary Examiner*—Stanley D. Miller
*Assistant Examiner*—B. P. Davis
*Attorney, Agent, or Firm*—Herbert L. Lerner; Laurence A. Greenberg

[57] ABSTRACT

Digital semiconductor circuit with a plurality of circuit parts selectively activatable by manual actuation of respective control switches includes a respective bistable flip-flop associated with each of the control switches, a common logic circuit disposed between the control switches and the bistable flip-flops and being connectible by n signal inputs thereof via the control switches, respectively, to a level of a logical "1", the common logic circuit having 2 n signal outputs pairwise combined, respective pairs of the signal outputs being disposed for controlling respective ones of the bistable flip-flops, each of the bistable flip-flops having a respective signal output for controlling a respective one of the circuit parts activatable by the respective control switches, the bistable flip-flops being initially in a first operating state wherein the circuit parts to be activated are in rest condition immediately subsequent to switching on of the digital semiconductor circuit, the common logic circuit having means responsive to sole actuation of a respective control switch for effecting a transition of the respectively associated bistable flip-flop from the first to the second operating state thereof only and for automatically resetting to the first operating state, with the transition, any nonselected bistable flip-flop which may yet be in the second operating state when the respective control switch is actuated, whereby the circuit part associated with the respective control switch is activated.

8 Claims, 3 Drawing Figures

DIGITAL SEMICONDUCTOR CIRCUIT

The invention relates to a digital semiconductor circuit with a plurality of circuit parts selectively activatable by manual operation of a respective operating and control switch.

In semiconductor circuits of this type, it may be desirable if 1. only a single one of these activatable circuit parts, respectively, is in the active operating condition and all of the others of these circuit parts are automatically switched off, and if, similarly, 2. during the continuous operation of an activated circuit part, the latter is switched off automatically if another one of these circuit parts should become activated.

This applies, for example, to circuit parts which serve for producing the various musical operating states of electronic musical instruments, such as an electronic organ, for example. There, the several circuit parts have the objective of generating musically representative combinations of tones and rhythms. Simultaneous operation of various of these circuit parts can understandably lead to undesirable effects. On the other hand, it is desired, however, that with the activation of a new circuit part, the circuit part operating theretofore be brought to rest automatically.

It is accordingly an object of the invention to provide a digital semiconductor circuit which produces the foregoing results, namely of automatically deactivating a previously operating circuit part when a new circuit part is activated.

According to the invention, it is proposed for this purpose that with each of the control switches $B_i$ (i=1, 2, 3, ... n), a respective bistable flip flop $FF_i$ be associated; that a common logic circuit be provided between the n control switches $B_i$ and the n bistable flip flops $FF_i$; and that this logic circuit be connectible by the respective signal inputs thereof, via the respective n control switches $B_i$ to a level of a logical "1"; and, furthermore, that 2n signal outputs of the logic circuit are pairwise combined and a pair $A_i$, $A^*_i$, respectively, of these signal outputs is provided for controlling, respectively, one of the bistable flip flops $FF_i$, as well as, respectively, a signal output of each of the bistable flip flops $FF_i$ is provided for controlling a respective one of the circuit parts activatable by the individual control switches $B_i$; that provision is furthermore made that, immediately after the digital semiconductor circuit is switched on, the n bistable flip flops $FF_i$ are initially in a first operating state, wherein the circuit parts to be activated are in rest condition and that, finally, the common logic circuit is so constructed that, when each of the n control switches $B_i$, is actuated, activation of the circuit part associated therewith occurs due to the transition of the respectively associated bistable flip-flop $FF_i$ from the first to the second operating state only if this control switch $B_i$ is solely actuated, and that, with this transition, an automatic resetting to the first operating state of any non-selected bistable flip-flops $FF_i$ which may yet be in the second operating state is effected.

Other features which are considered as characteristic for the invention are set forth in the appended claims.

Although the invention is illustrated and described herein as embodied in a digital semiconductor circuit, it is nevertheless not intended to be limited to the details shown, since various modifications and structural changes may be made therein without departing from the spirit of the invention and within the scope and range of equivalents of the claims.

Figure 2:
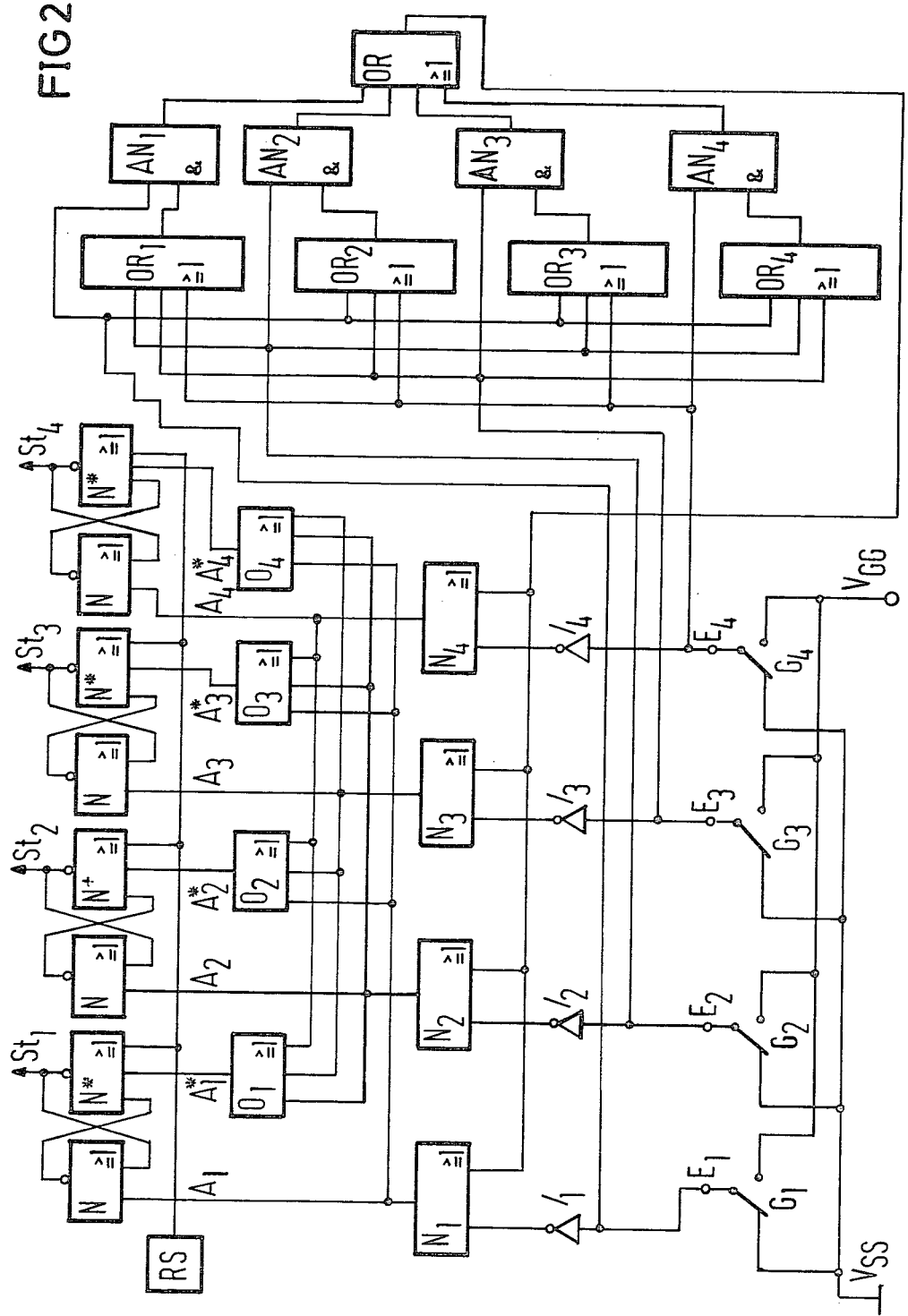
Figure 3:
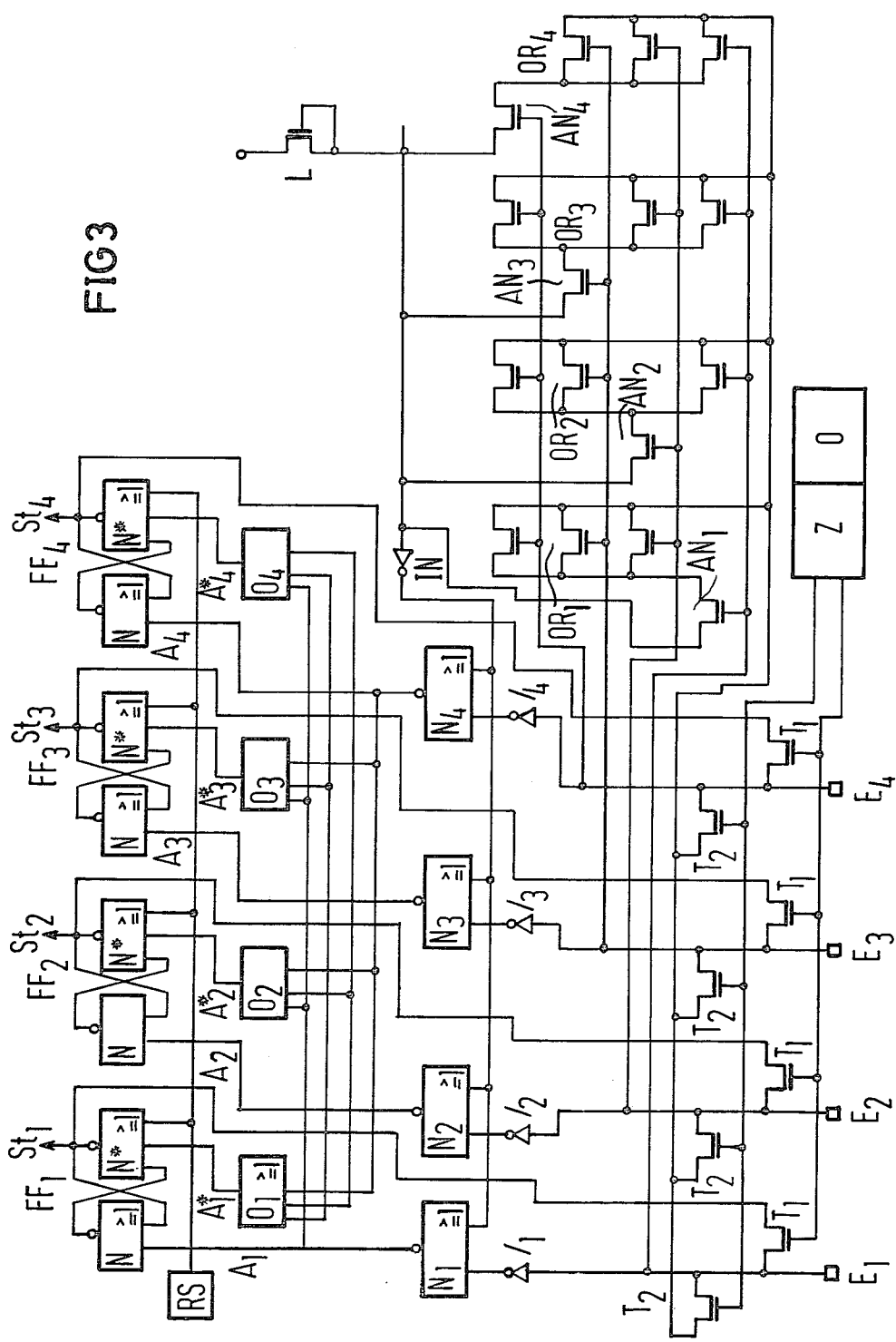

The construction and method of operation of the invention, however, together with additional objects and advantages thereof will be best understood from the following description of specific embodiments when read in connection with the accompanying drawings, in which:

FIG. 1 is a block diagram of a digital semiconductor circuit according to the invention; and FIGS. 2 and 3 are preferred embodiments of such a semiconductor circuit, taking into consideration details of the circuit construction.

It should be noted that the digital semiconductor circuit according to the invention can be realized in monolithically integrated form.

Referring now to the drawing and first, particularly, to FIG. 1 thereof, there are shown so-called sensor switches which are used as control switches $B_i$, i.e. $B_1$, $B_2$ ... $B_n$. A sensor switch as is well known, is formed of a first electrode acted upon by one of the operating potentials of the semiconductor circuit, and a second electrode which is connected to the respective signal input $E_i$ of the logic circuit L, a free gap between the two electrodes of the sensor switch $B_i$ when actuated, being bridgable by a resistance which is provided by the finger of the person actuating the sensor switch $B_i$. Consequently, a signal corresponding to the level of a logical "1" is present at the input $E_i$ of the logic circuit L associated with the respective sensor switch $B_i$ only as long as the sensor switch $B_i$ is actuated by the body of the operating personnel. However, the control switches $B_i$ can, on the other hand, also be normal monostable switches (pushbuttons).

With each of the n operating or control switches $B_i$, there is associated a signal input $E_i$ of the common logic circuit L. In addition to the n signal inputs $E_1$, ... $E_n$, the logic circuit L also has 2n signal outputs which are respectively, pairwise combined. The output pair $A_i$, $A^*_i$ of the logic circuit L is associated with the signal input $E_i$ thereof and therefore with the operating switch $B_i$, so that therewith the input $E_1$ is provided for controlling the outputs $A_1$, $A^*_1$ and the input $E_2$ for controlling the outputs $A_2$, $A^*_2$, etc. Each of these output pairs $A_i$, $A^*_i$ serves for controlling a respective bistable flip-flop $FF_i$ i.e. a flip-flop cell. These flip-flop cells $FF_i$ are constructed especially in the same manner as can be seen from FIGS. 2 and 3.

That output of the individual bistable flip-flop $FF_i$ which has the logic level "0" when there is no logical "1" at the signal input thereof i.e. the Q output thereof, serves for controlling the circuit part $St_i$ which is to be activated via the control switch $B_i$ associated therewith; the construction of this circuit part may be effected in any desired manner and therefore need not be described in detail here.

In addition to the first operating potential $V_{GG}$ that can be applied via the individual control switches $B_i$ to the individual signal inputs $E_i$ of the common logic circuit L, a second operating potential $V_{SS}$ is provided which is used as reference potential via ground and can be applied at the required points of the logic circuit L, the individual flip-flop cells $FF_i$ and the further circuit parts $St_i$, just as the first operating potential $V_{GG}$. This is accomplished, for example, by means of a switch S. By applying the two operating potentials, a circuit part RS is activated, the output of which supplies a resetting pulse to resetting inputs R of the individual flip-flop cells $FF_i$. Thereby, the flip-flop cells $FF_i$, which are in the second operating state, are automatically transferred into the first operating state, while the flip-flop cells $FF_i$ in the first operating state maintain the first operating state thereof.

The first operating state of the individual flip-flop cells $FF_i$ is characterized by the fact that, when it is present, the further circuit part $St_i$ which can be switched-on via the flip-flop cell $FF_i$, is in the rest position, whereas it is activated by the transition of the flip-flop cell $FF_i$ into the second operating state.

With respect to a more detailed construction of the common logic circuit L, FIGS. 2 and 3 show advantageous embodiments thereof. In both cases, the total number of the inputs $E_i$ and, therefore, also the control switches $B_i$, as well as the further circuit parts which can be activated thereby is $n=4$, respectively.

Each of the n inputs $E_i$ is connected via a respective inverter $I_i$ to one of the two inputs of a respective NOR gate $N_i$, while the second input of these NOR gates $N_i$ is connected to a common source for a blocking signal which will be described in greater detail hereinafter. The output of the individual NOR gates $N_i$ forms a signal output $A_i$ of the logic circuit L. Each of the inputs $E_i$ can be addressed with or acted upon by a level of a logical "1" via a respective one of the n control switches $B_i$. The result of such an address or action is that a logical "1" appears also at the corresponding output $A_i$. This logical "1" serves for controlling the one signal input of the flip-flop cell $FF_i$ associated with the respective input $E_i$ and, accordingly, with the output $A_i$ of the logic circuit L.

Each of the NOR gates $N_i$ participates, furthermore, in the control of the logical state of the outputs $A^*_j$ of the logic circuit L ($j=1, \ldots n$) of which only the case $j=i$ is an exception. The output $A^*_i$ of the logic circuit L is therefore not co-addressed or co-controlled by the NOR gate $N_i$ forming the associated output $A_1$.

For this purpose, the respective output $A^*_i$ which is combined with the respective signal output $A_i$ of the logic circuit L to form an output pair, is provided by the signal output of a respective OR gate $O_i$, the $(n-1)$ signal inputs of which are respectively connected to the signal output of a respective one of the NOR gates $N_j$, for which the condition $j \neq i$ is met. As an alternative thereto, the individual inputs of these OR gates $O_i$ may be connected with a respective one of the signal inputs $E_j$ of the logic circuit, for which the condition $J \neq i$ applies.

The individual inputs $E_i$ of the logic circuit L serve, furthermore, for controlling the source which furnishes the hereinaforementioned blocking signal and which is represented by n further logic units which are formed, respectively, of a combination of an OR gate $OR_i$ with $(n-1)$ respective signal inputs and an AND gate $AN_i$ with two inputs, respectively, the outputs of the AND gate $AN_i$ furnishing the blocking signal via a further common OR gate OR.

The system shown in FIG. 3, differs somewhat from the system according to FIG. 2 with respect to the layout of the source for the blocking signal.

In the embodiment of the invention shown in FIG. 2, the individual signal input $E_i$ of the logic circuit L is in the region of the part of the logic circuit serving to generate the blocking signal, at one input of a respective one of the hereinaforementioned AND gates $AN_i$, the other input of which is addressed or acted upon by the OR gate $OR_i$ belonging to the AND gate $AN_i$. The individual inputs of this OR gate $OR_i$ are connected respectively to one of the $(n-1)$ signal inputs $E_j$ which meet the conditon $j \neq i$. All of the outputs of the AND gates $AN_i$ serve to control the aforementioned OR gate OR, a respective one of the n inputs of the OR gate OR being connected to the output of a respective one of the n AND gates $AN_i$.

The output of the common OR gate OR, finally, is connected to the second inputs of the hereinabove previously described n NOR gate $N_i$ and, accordingly, controls the logic level of the outputs $A_i$ and, indirectly, the outputs $A^*_i$ of the logic circuit L.

In the case of the illustrated embodiments of FIGS. 2 and 3, the n flip-flop cells $FF_i$ which are controlled by respective pairs of corresponding signal outputs $A_i$, $A^*_i$ of the logic circuit L are realized by RS flip-flops, the two signal inputs of which are connected to a respective one of the outputs $A_i A^*_i$ of the associated output pair of the logic circuit L. The individual flip-flops $FF_i$ are formed of cross-coupled NOR gates N and $N^*$.

To form the individual flip-flop cells $FF_i$, the output of the two NOR gates N and $N^*$ of the individual cell are connected to a respective input of the other gate and, thereby, a cross-coupling is produced. The gate N has yet a second input which is connected to the output $A_i$ of the corresponding output pair $A_i$, $A^*_i$ of the logic circuit L. The gate $N^*$ likewise has a second input which is connected to the output $A^*_i$ of the associated pair of outputs. The gate $N^*$, finally, has a third input which is controlled by the reset pulses delivered by the system RS and affords a switch-back of the respective flip-flop cell from the second operating state thereof into the first operating state thereof. A resetting pulse delivered by the system RS ensures, when the overall system is switched-on via the switch S, that all flip-flop cells $FF_i$ are initially in the first operating state. The output of the NOR gates $N^*$ of the individual flip-flop cells $FF_i$ is, furthermore, the Q output and, with the transition of the respective flip-flop cell $FF_i$ into the second operating state, transmits an activation signal to the further circuit part $St_i$ which is to be controlled by the flip-flop $FF_i$.

If a logical "1" is then applied to the input $E_i$ of the logic circuit L by actuating one of the respective control switches $B_i$, then this "1" also appears at the output of the NOR gate $N_i$, unless at the second input thereof a "1" delivered by the OR gate OR is present. This "1" appearing at the output of the NOR gate $N_i$ arrives at the input of the NOR gate N in the flip-flop $FF_i$ via the output $A_i$ of the logic circuit L. In addition, it reaches a respective one of the $(n-1)$ inputs of the $(n-1)$ OR gates $O_j$ which meet the requirement $j \neq i$. Thereby, the outputs $A^*_j$ of the logic circuit L likewise receive a "1" which ensures, via the NOR gate $N^*$ of the respective associated flip-flop cells $FF_j$, that all these flip-flop cells $FF_j$ remain in the first operating state and the circuit parts $St_j$ controlled thereby are held in the inactive condition. Thus, only the flip-flop cell $FF_i$ flips into the second operating state, whereby the associated circuit part $St_i$ is activated.

If, on the other hand, at least two of the control switches $B_i$ are simultaneously actuated, a "1" will always arrive at the OR gate OR through one of the AND gates $AN_i$; the OR gate passes this "1" to the second inputs of all of the NOR gates $N_i$ controlling a respective output $A_i$ of the logic circuit L. Thereby, a "0" is present at the outputs of all of these NOR gates $N_i$, so that the previous operating state of the flip-flop cells $FF_i$ is maintained.

If, on the other hand, only one signal control switch $B_i$ is actuated, then the associated flip-flop cell $FF_i$ is activated as described hereinbefore. Since a "1" appears in every case at the outputs of the $(n-1)$ OR gates $O_j$ with $j \neq i$, whereas a "0" appears at the output OR gate $O_i$, a flip-flop cell $FF_j$, which is in the second operating state, flips back into the first operating state because of the actuation of the control switch $B_i$, which is accompanied by a switching-off of the circuit part $St_j$ associated with the flip-flop cell $FF_j$.

As is apparent, the part of the common logic circuit L made up of the AND gate $AN_i$ and the OR gate $OR_i$ and OR, respectively, together with the NOR gates $N_i$ forms a blocking circuit which prevents a plurality of flip-flop cells $FF_i$ from being simultaneously in the operating state. The invention therefore provides an electronic substitute for key interlocks operating mechanically in electronic musical instruments, which successfully avoids the disadvantages of mechanical key interlocks, particularly the great depth and high cost thereof.

The embodiment of a digital semiconductor circuit according to the invention shown in FIG. 3 differs from the embodiment according to FIG. 2 mainly only by the somewhat different construction of the part of the logic circuit L serving to generate the blocking signal to be delivered to the NOR gates $N_i$, which is provided in the form of combinations of MOS field effect transistors of the enrichment or enhancement type, as well as the addition of two features advantageous in case sensor switches are used as control switches $B_i$ and the digital semiconductor circuit is constructed in monolithically integrated form.

Thus, the embodiment of the device according to the invention shown in FIG. 3 corresponds to the presentation according to FIG. 2 with respect to the construction of the flip-flop cells $FF_i$, the inverters $I_i$, the NOR gates $N_i$ and the OR gates $O_i$. A modification is provided with respect to the part of the logic circuit L providing the blocking signal, inasmuch as the OR-AND functions provided in FIG. 2 (that is, respectively, the sequence of an OR-AND stage $OR_i$, $AN_i$) are connected via a common load resistance L to the first operating potential $V_{GG}$ and, in this manner, the OR-AND function is inverted. The output of this part, which is shown as using otherwise nonidentified MOS field effect transistors of the enrichment type, is represented by an inverter IN, the output of which provides the blocking signal to be applied to the NOR gate $N_i$.

When sensor switches are used as the control switches $B_i$, it is advisable to take into consideration the disclosure of copending U.S. patent application Ser. No. 144,035 filed Apr. 28, 1980 and assigned to the same corporate assignee as that of the instant application This copending patent application relates to a monolithically integrated digital semiconductor circuit with MOS field effect transistors and an electrical lead, which is to be used as the signal input, located on the semiconductor body containing the semiconductor circuit. This monolithically integrated digital semiconductor circuit formed on a semiconductor body and having MIS field-effect transistors and an electric terminal as signal input in the semiconductor body comprises respective means for applying two operating potentials to the digital semiconductor circuit, a manually actuatable sensor switch connecting the respective means to the electric terminal for applying one of the operating potentials thereto, one of the MIS field-effect transistors having a source drain path and a control gate, the transistor being rendered conductive by an electric pulse applied to the gate thereof and the electric terminal being connected in the semiconductor body to the means for applying the other of the operating potentials thereto through the source-drain path of the transistor, an additional circuit component forming part of the digital semiconductor circuit and representing an AND function, the additional circuit component having at least one terminal connected to the electric terminal and being activatable by an electric pulse applied thereto, and a pulse generating system connected to the gate of the transistor and to the additional circuit component for generating a respective pulse $\phi_1$ and $\phi_2$ for activating the transistor and the additional circuit component, respectively. In the aforementioned copending application, various embodiments of such a monolithically integrated digital semiconductor circuit are described.

After the sensor switch is actuated, these monolithically integrated digital semiconductor circuits can generate a reply signal acknowledging that the signal produced thereby is passed on to the digital semiconductor circuit proper, and can transmit this reply signal via the aforementioned electrical terminal of the semiconductor body to an external display device, such as a light-emitting diode, for example.

In applying the measures described in the hereinaforementioned copending application to the invention of the instant application, each input $E_i$ of the logic circuit L is realized by a respective terminal of the semiconductor body which incorporates the entire circuit with the exception of the display device. A respective one of the circuits described in the aforementioned copending application is then associated with each of the inputs $E_i$; a binary counter Z can be used as the pulse generator system and is controlled by a possibly common oscillator O. This binary counter Z delivers via a decoder a gate pulse $\phi_1$ required for the respective transistor $T_i$ (that is, for the first transistor according to the definition given in the copending U.S. Application), so that the lead or terminal $E_i$ electrically charged by the operation of the sensor switch $B_i$ is discharged by contact with the reference potential $V_{SS}$ via the transistor $T_1$. In addition, the counter Z provides, via the decoder, for the generation of a second pulse $\phi_2$ by means of which, finally, the control signal is generated which is to be applied to the gates of the transistors $T_2$ which transmit or pass-on the reply signal for the actuation of the sensor switch to the respective electrical connection $E_1$.

There are claimed:

1. Digital semiconductor circuit with a plurality of circuit parts selectively activatable by manual actuation of respective control switches comprising a respective bistable flip-flop associated with each of the control switches, a common logic circuit disposed between the control switches and the bistable flip-flops and being connectible by n signal inputs thereof via the control switches, respectively, to a level of a logical "1", said common logic circuit having 2 n signal outputs pairwise combined, respective pairs of said signal outputs being disposed for controlling respective ones of said bistable flip-flops, each of said bistable flip-flops having a respective signal output for controlling a respective one of the circuit parts activatable by the respective control switches, said bistable flip-flops being initially in a first operating state wherein the circuit parts to be activated are in rest condition immediately subsequent to switching on of the digital semiconductor circuit, said common logic circuit having means responsive to sole actuation of a respective control switch for effecting a transition of the respectively associated bistable flip-flop from said first to said second operating state thereof only and for automatically resetting to said first operating state, with said transition, any nonselected bistable flip-flop which may yet be in said second operating state when the respective control switch is actuated, whereby the circuit part is associated with the respective control switch is activated, the circuit including respective inverters connected to respective ones of said n signal inputs of said common logic circuit addressable by respective ones of the control switches for controlling respective NOR gates having two inputs, one of the inputs of a respective NOR gate being connected to one of said inverters, respectively, and the other of the inputs of the NOR gates being connected in common to another part of said common logic circuit from which a blocking signal is deliverable to all of said NOR gates, the respective NOR gates having an output forming a respective first signal output of said common logic circuit, and including a respective second signal output of said common logic circuit formed by an output of a respective OR gate having (n−1) signal inputs respectively controllable by one of the signal inputs to said common logic circuit which is associated with the others of the control switches, the circuit further including respective AND gates and (n−1) of a total of n additional OR gates having respective inputs connected to the signal inputs of said common logic circuit and controllable thereby, each of said AND gates being associated respectively with one of said (n−1) additional OR gates, said (n−1) additional OR gates having a respective output connected to another input of the respective AND gates associated therewith, said other part of said common logic circuit from which the blocking signal is deliverable comprising yet a further OR gate having respective inputs connected to respective outputs of said AND gates and controllable thereby.

2. Digital semiconductor circuit with a plurality of circuit parts selectively activatable by manual actuation of respective control switches comprising a respective bistable flip-flop associated with each of the control switches, a common logic circuit disposed between the control switches and the bistable flip-flops and being connectible by n signal inputs thereof via the control switches, respectively, to a level of a logical "1", said common logic circuit having 2 n signal outputs pairwise combined, respective pairs of said signal outputs being disposed for controlling respective ones of said bistable flip-flops, each of said bistable flip-flops having a respective signal output for controlling a respective one of the circuit parts activatable by the respective control switches, said bistable flip-flops being initially in a first operating state wherein the circuit parts to be activated are in rest condition immediately subsequent to switching on of the digital semiconductor circuit, said common logic circuit having means responsive to sole actuation of a respective control switch for effecting a transition of the respectively associated bistable flip-flop from said first to said second operating state thereof only and for automatically resetting to said first operating state, with said transition, any nonselected bistable flip-flop which may yet be in said second operating state when the respective control switch is actuated, whereby the circuit part is associated with the respective control switch is activated, the circuit including respective inverters connected to respective ones of said n signal inputs of said common logic circuit addressable by respective ones of the control switches for controlling respective NOR gates having two inputs, one of the inputs of a respective NOR gate being connected to one of said inverters, respectively, and the other of the inputs of the NOR gates being connected in common to another part of said common logic circuit from which a blocking signal is deliverable to all of said NOR gates, the respective NOR gates having an output forming a respective first signal output of said common logic circuit, and including a respective second signal output of said common logic circuit formed by an output of a respective OR gate having (n−1) signal inputs respectively controllable by one of the signal inputs to said common logic circuit which is associated with the others of the control switches, the circuit further including respective AND gates and (n−1) of a total of n additional OR gates having respective inputs connected to the signal inputs of said common logic circuit and controllable thereby, each of said AND gates being associated respectively with one of said (n−1) additional OR gates having a respective output connected to another input of the respective AND gates associated therewith, said AND gates, respectively, having an output connected in common to said other part of said common logic circuit from which the blocking signal is deliverable, said other part comprising the input of an inverter having an output controllably connected to the other of the two inputs of the respective NOR gates having the outputs forming the respective first signal outputs of said common logic circuit, said input of said inverter being connected through a load resistance to an operating potential delivering the level of the logical "1" for the inputs of said common logic circuit.

3. Digital semiconductor circuit with a plurality of circuit parts selectively activatable by manual actuation of respective control switches comprising a respective bistable flip-flop associated with each of the control switches, a common logic circuit disposed between the control switches and the bistable flip-flops and being connectible by n signal inputs thereof via the control switches, respectively, to a level of a logical "1", said common logic circuit having 2 n signal outputs pairwise combined, respective pairs of said signal outputs being disposed for controlling respective ones of said bistable flip-flops, each of said bistable flip-flops having a respective signal output for controlling a respective one of the circuit parts activatable by the respective control switches, said bistable flip-flops being initially in a first operating state wherein the circuit parts to be activated are in rest condition immediately subsequent to switching on of the digital semiconductor circuit, said common logic circuit having means responsive to sole actuation of a respective control switch for effecting a transition of the respectively associated bistable flip-flop from said first to said second operating state thereof only and for automatically resetting to said first operating state, with said transition, any nonselected bistable flip-flop which may yet be in said second operating state when the respective control switch is actuated, whereby the circuit part associated with the respective control switch is activated, the circuit including respective inverters connected to respective ones of said n signal inputs of said common logic circuit addressable by respective ones of the control switches for controlling respective NOR gates having two inputs, one of the inputs of a respective NOR gate being connected to one of said inverters, respectively, and the other of the NOR gates being connected in common to another part of said common logic circuit from which a blocking signal is deliverable to all of said NOR gates, the respective NOR gates having an output forming a respective first signal output of said common logic circuit, and including a respective second signal output of said common logic circuit formed by an output of a respective OR gate having (n−1) signal inputs controllable through the outputs of all of those NOR gates provided for controlling, respectively, a different bistable flip-flop than for the respective OR gate, and the circuit further including respective AND gates and (n−1) of a total of n additional OR gates having respective inputs connected to the signal inputs of said common logic circuit and controllable thereby, each of said AND gates being associated respectively with one of said (n−1) additional OR gates, said (n−1) additional OR gates having a respective output connected to another input of the respective AND gates associated therewith, said other part of said common logic circuit from which the blocking signal is deliverable comprising yet a further OR gate having respective inputs connected to respective outputs of said AND gates and controllable thereby.

4. Digital semiconductor circuit with a plurality of circuit parts selectively activatable by manual actuation of respective control switches comprising a respective bistable flip-flop associated with each of the control switches, a common logic circuit disposed between the control switches and the bistable flip-flops and being connectible by n signal inputs thereof via the control switches, respectively, to a level of a logical "1", said common logic circuit having 2 n signal outputs pairwise combined, respective pairs of said signal outputs being disposed for controlling respective ones of said bistable flip-flops, each of said bistable flip-flops having a respective signal output for controlling a respective one of the circuit parts activatable by the respective control switches, said bistable flip-flops being initially in a first operating state wherein the circuit parts to be activated are in rest condition immediately subsequent to switching on of the digital semiconductor circuit, said common logic circuit having means responsive to sole actuation of a respective control switch for effecting a transition of the respectively associated bistable flip-flop from said first to said second operating state thereof only and for automatically resetting to said first operating state, with said transition, any nonselected bistable flip-flop which may yet be in said second operating state when the respective control switch is actuated, whereby the circuit part associated with the respective control switch is activated, and the circuit including respective inverters connected to respective ones of said n signal inputs of said common logic circuit addressable by respective ones of the control switches for controlling respective NOR gates having two inputs, one of the inputs of a respective NOR gate being connected to one of said inverters, respectively, and the other of the NOR gates being connected in common to another part of said common logic circuit from which a blocking signal is deliverable to all of said NOR gates, the respective NOR gates having an output forming a respective first signal output of said common logic circuit, and including a respective second signal output of said common logic circuit formed by an output of a respective OR gate having (n−1) signal inputs controllable through the outputs of all of those NOR gates provided for controlling, respectively, a different bistable flip-flop than for the respective OR gate, the circuit further including respective AND gates and (n−1) of a total of n additional OR gates having respective inputs connected to the signal inputs of said common logic circuit and controllable thereby, each of said AND gates being associated respectively with one of said (n−1) additional OR gates having a respective output connected to another input of the respective AND gates associated therewith, said AND gates, respectively, having an output connected in common to said other part of said common logic circuit from which the blocking signal is deliverable, said other part comprising the input of an inverter having an output controllably connected to the other of the two inputs of the respective NOR gates having the outputs forming the respective first signal outputs of said common logic circuit, said input of said inverter being connected through a load resistance to an operating potential delivering the level of the logical "1" for the inputs of said common logic circuit.

5. Circuit according to claim 1 or 2 or 3 or 4 wherein the control switches associated with the circuit parts to be activated are constructed as sensor switches.

6. Circuit according to claim 1 or 2 or 3 or 4 wherein said bistable flip-flops are formed as RS flip-flops with reset input.

7. Circuit according to claim 1 or 2 or 3 or 4 comprising a monolithic integral structure.

8. Circuit according to claim 1 or 2 or 3 or 4 wherein the plurality of circuit parts forming the digital semiconductor circuit are formed in accordance with MOS technology.

* * * * *

UNITED STATES PATENT AND TRADEMARK OFFICE
CERTIFICATE OF CORRECTION

PATENT NO. : 4,380,705
DATED : April 19, 1983
INVENTOR(S) : HELMUT RÖSLER

It is certified that error appears in the above-identified patent and that said Letters Patent are hereby corrected as shown below:

In the heading to the printed specification, under "Foreign Application Priority Data" the number "333863" should be changed to --29 22 752.9--.

Signed and Sealed this

Fourth Day of December 1984

[SEAL]

Attest:

GERALD J. MOSSINGHOFF

Attesting Officer         Commissioner of Patents and Trademarks